United States Patent
Matsubara et al.

(10) Patent No.: US 7,986,012 B2
(45) Date of Patent: Jul. 26, 2011

(54) SEMICONDUCTOR DEVICE AND PROCESS FOR MANUFACTURING SAME

(75) Inventors: Yoshihisa Matsubara, Kanagawa (JP); Takashi Sakoh, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 260 days.

(21) Appl. No.: 12/345,015

(22) Filed: Dec. 29, 2008

(65) Prior Publication Data
US 2009/0159978 A1    Jun. 25, 2009

(30) Foreign Application Priority Data
Dec. 25, 2007    (JP) .................................. 2007-332717

(51) Int. Cl.
*H01L 21/71*    (2006.01)
(52) U.S. Cl. ................ 257/368; 257/E21.619; 438/589; 438/638
(58) Field of Classification Search .................. 257/332, 257/334, 368, 296, 382, 383, 384, E21.619, 257/E21.621, E21.624, E21.634, E21.638; 438/270, 589, 638, 675
See application file for complete search history.

(56) References Cited

U.S. PATENT DOCUMENTS

| 6,291,278 | B1 * | 9/2001 | Xiang et al. | 438/197 |
| 6,420,273 | B1 | 7/2002 | Lin | |
| 6,515,338 | B1 * | 2/2003 | Inumiya et al. | 257/368 |
| 6,649,455 | B2 * | 11/2003 | Murakami | 438/149 |
| 7,307,324 | B2 * | 12/2007 | Uchiyama | 257/397 |

FOREIGN PATENT DOCUMENTS

| JP | 2003-168732 | 6/2003 |
| JP | 2006-351582 | 12/2006 |
| JP | 2006-351978 | 12/2006 |

OTHER PUBLICATIONS

Chinese Patent Office issued a Chinese Office Action dated Apr. 13, 2010, Application No. 200810188589.7.

* cited by examiner

*Primary Examiner* — Victor Mandala
*Assistant Examiner* — Scott Stowe
(74) *Attorney, Agent, or Firm* — Young & Thompson

(57) ABSTRACT

A semiconductor device 100 includes a first gate 210, which is formed using a gate last process. The first gate 210 includes a gate insulating film formed in a bottom surface in a first concave portion formed in the insulating film; a gate electrode formed over the gate insulating film in the first concave portion; and a protective insulating film 140 formed on the gate electrode in the first concave portion. In addition, the semiconductor device 100 includes a contact 134, which is coupled to the N-type impurity-diffused region 116a in the both sides of the first gate 210 and is buried in the second concave portion having a diameter that is large than the first concave portion.

5 Claims, 10 Drawing Sheets

DRAM

DRAM

DRAM

US 7,986,012 B2

SEMICONDUCTOR DEVICE AND PROCESS FOR MANUFACTURING SAME

The present application is based on Japanese patent application No 2007-332,717, the content of which is incorporated hereinto by reference.

BACKGROUND

Technical Field

The present invention relates to a semiconductor device and a method for manufacturing thereof.

In recent years, a gate last process (damascene gate process), which involves forming a gate electrode after a source drain is formed, is often employed for a process for forming a metallic gate. Japanese Patent Laid-Open No. 2006-351,580 and Japanese Patent Laid-Open No. 2006-351,978 disclose configurations of manufacturing gates using gate last processes. The gate last process involves first forming a dummy gate electrode by utilizing a polysilicon layer, and then forming a source and a drain through a mask of the dummy gate electrode. Subsequently, the dummy gate electrode is covered with an insulating film, and a surface of an insulating film is planarized using a chemical mechanical polishing (CMP) process or the like, and then the dummy gate electrode is selectively removed to form a concave portion in the insulating film. Thereafter, the inside of the concave portion is filled with a metallic material, and the portions of the metallic material exposed outside the concave portion are removed using the CMP process or the like to form a gate electrode. A use of such process allows utilizing metallic materials that are otherwise difficult to be patterned for the electrode material.

Meanwhile, in a fine structure having narrower spacing between elements, when a misalignment is caused in a pattern during the process for forming a contact hole coupled to the source and the drain of the transistor, the contact hole overlaps with the gate electrode, causing a problem of a short circuit between the contact and the gate electrode.

Japanese Patent Laid-Open No. 2003-168,732 discloses a configuration, in which a conductive material and a silicon nitride coat layer are formed on a semiconductor substrate and are patterned to a shape of a gate electrode. This provides a structure having an insulating silicon nitride coat layer provided on the conductive material of the gate electrode. Therefore, such structure prevents a short circuit of the contact and the gate electrode even if the contact hole overlaps with the gate electrode.

The present inventors have recognized as follows. Since the gate last process provides the gate electrode formed by filling the concave portion created in the insulating film with a metallic material, it is not possible to pattern the insulating coat layer and the metallic material constituting the gate electrode. For example, even in the case of selectively patterning to partially leave the insulating film only above the metallic material in the location of the concave portion after filling the concave portion with a metallic material and then forming an insulating film on the entire surface of the semiconductor substrate, the use of the fine structure causes a misalignment in the pattern as discussed above, and thus a desired patterning is difficult to be achieved.

SUMMARY

In one aspect according to the present invention, there is provided a semiconductor device, comprising: a semiconductor substrate; an insulating film formed over the semiconductor substrate; a first gate, including: a gate insulating film formed in a bottom surface in a first concave portion formed in said insulating film; a gate electrode formed over the gate insulating film in the first concave portion; and a protective insulating film formed over the gate electrode in the first concave portion; a source-drain region provided in the side of the first gate; and a contact formed in a second concave portion being formed in the side of the first concave portion in the insulating film and having a diameter that is larger than a diameter of the first concave portion, and coupled to the source-drain region, wherein said gate electrode is composed of a film of first metal and a film of second metal coating a bottom surface and a side surface of the film of first metal.

In another aspect according to the present invention, there is provided a method for manufacturing a semiconductor device, including: forming a dummy gate electrode over a semiconductor substrate; injecting impurity to the semiconductor substrate through a mask of said dummy gate electrode to form a source-drain region; forming a first insulating film covering the dummy gate electrode, over the semiconductor substrate; planarizing the first insulating film to expose an upper surface of said dummy gate electrode; selectively removing the first insulating film to form a contact hole being coupled to the source-drain region in said first insulating film; removing the dummy gate electrode to form a first concave portion in the first insulating film, the first concave portion having smaller diameter than the contact hole; forming a metallic film over the entire surface of the semiconductor substrate to fill the contact hole and the first concave portion with the metallic film; removing portions of the metallic film exposed outside of the contact hole and the first concave portion using a chemical mechanical polishing (CMP) process to form a contact in the contact hole and a gate electrode in the first concave portion, respectively, and removing portions of the metallic film in an upper portion within the first concave portion to form a recess in the upper portion within the first concave portion; forming a second insulating film over the entire surface of the semiconductor substrate to fill the recess with the second insulating film; removing portions of the second insulating film exposed outside of the first concave portion to selectively leave the second insulating film over the gate electrode in the first concave portion; forming a third insulating film over the entire surface of the semiconductor substrate; selectively removing the third insulating film to form a hole being coupled to the contact in the third insulating film; and filling the inside of the hole with a conducting film to form a plug, the plug being electrically coupled to the contact.

The present inventors found the fact that the diameter of the first concave portion formed in the insulating film by removing the dummy gate electrode is smaller than the diameter of the second concave portion serving as a contact hole in the case of employing the gate last process, may be utilized to achieve that the recess can be selectively formed only in the upper portion in the inside of the first concave portion having a smaller diameter by suitably controlling the condition of the CMP process, which is conducted after these concave portions are filled with the metallic film. Further, it is also found that an insulating film is formed over the entire surface to fill the inside of the recess with the insulating film and then the exposed portions of the insulating film outside of the recess are removed, so that a protective insulating film can be selectively formed on the gate electrode, even if the gate last process is employed, leading to the completion of the present invention. This allows preventing a short circuit between the contact coupled to the source-drain region and the gate electrode, even in the case of the gate structure being formed in the gate last process.

Here, any combination of each of these constitutions or conversions between the categories of the invention such as a process, a device, a method for utilizing the device and the like may also be within the scope of the present invention.

According to the present invention, a short circuit between the contact coupled to the source-drain region and the gate electrode can be prevented in the gate structure formed in the gate last process.

BRIEF DESCRIPTION OF THE DRAWINGS

The above and other objects, advantages and features of the present invention will be more apparent from the following description of certain preferred exemplary embodiments taken in conjunction with the accompanying drawings, in which.

DETAILED DESCRIPTION OF THE PREFERRED EMBODIMENTS

Figure 1:
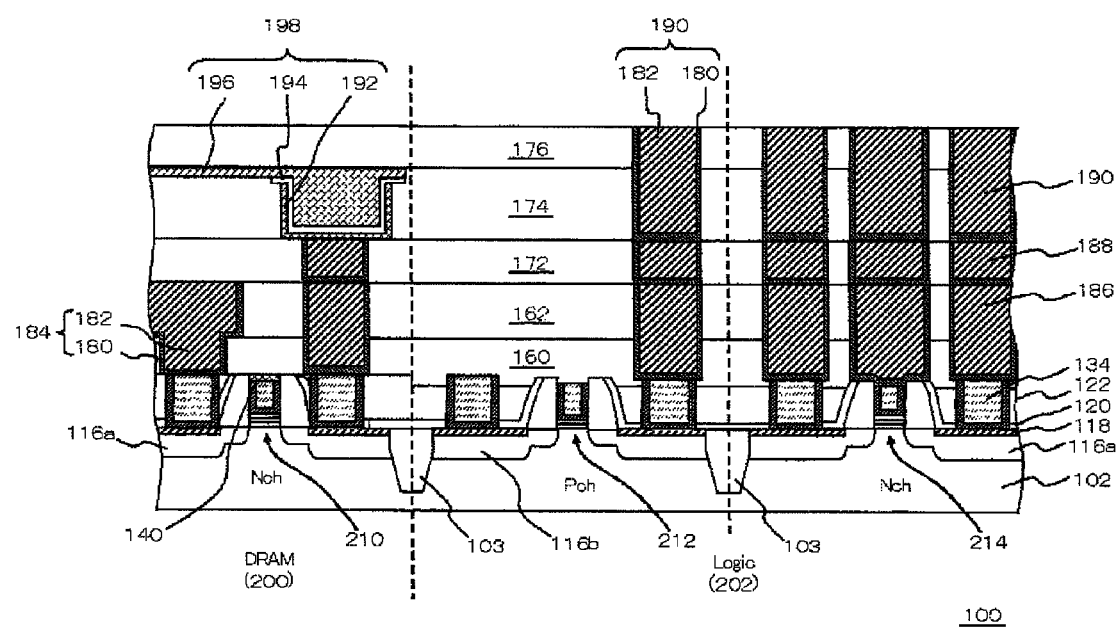
FIG. 1 is a cross-sectional view of a semiconductor device, illustrating a configuration of a semiconductor device according to an exemplary embodiment of the present invention.

The invention will be now described herein with reference to illustrative exemplary embodiments. Those skilled in the art will recognize that many alternative exemplary embodiments can be accomplished using the teachings of the present invention and that the invention is not limited to the exemplary embodiments illustrated for explanatory purposed.

Exemplary implementations according to the present invention will be described in detail as follows in reference to the drawings. In all drawings, an identical numeral is assigned to an element commonly appeared in the drawings, and the detailed description thereof will not be repeated.

FIG. 1 is a cross-sectional view, illustrating a configuration of a semiconductor device 100 in the present exemplary embodiment. The semiconductor device 100 includes a semiconductor substrate 102, which compatibly contains a dynamic random access memory region 200 (DRAM region) serving as a memory region (indicated as "DRAM" in the diagram) and a logic region 202 serving as a logic region (indicated as "Logic" in the diagram). The semiconductor substrate 102 is, for example, of a silicon substrate. In addition, the logic region 202 is provided with a P-type channel region (indicated as "Pch" in the diagram) and an N-type channel region ("Nch" in the diagram). In addition, the DRAM region 200 may be designed to be an N-type channel region. These regions are isolated by element isolation insulating films 103. The N-type channel region of DRAM region 200 and the N-type channel region of logic region 202 are provided with N-type impurity-diffused regions 116a, and the P-type channel region of the logic region 202 is provided with the P-type impurity-diffused regions 116b. In addition to above, the DRAM region 200 has fine structure having the distances between the elements, which are narrower than that in logic region 202. More specifically, in the DRAM region 200, the distances between the respective gates are narrower than that in the logic region 202. Therefore, higher risk for causing a short circuit between the elements in the event of causing a pattern misalignment is arisen in the DRAM region 200.

Over the semiconductor substrate 102, the DRAM region 200 is provided a first gate 210, the P-type channel region of the logic region 202 is provided with a second gate 212, and the N-type channel region of the logic region 202 is provided with a third gate 214. Further, source-drain regions, each of which is composed of an N-type impurity-diffused region 116a, are provided in the both sides of the first gate 210 and the third gate 214, respectively. In addition, source-drain regions, each of which is composed of a P-type impurity-diffused region 116b, are provided in the both sides of the second gate 212, respectively.

The semiconductor device 100 includes an insulating film 120, an interlayer insulating film 122, an interlayer insulating film 160, an interlayer insulating film 162, an interlayer insulating film 172, an interlayer insulating film 174 and an interlayer insulating film 176, which are deposited in this sequence on semiconductor substrate 102. The interlayer insulating film 122 is formed to fill the first gate 210, the second gate 212 and the third gate 214 formed on the semiconductor substrate 102.

In the present exemplary embodiment, the first gate 210, the second gate 212 and the third gate 214 are configured to be formed using the gate last process. Each of the gates is configured of a gate insulating film formed in a bottom surface of a concave portion formed in then insulating film (concave portion 126 as will be discussed later) composed of the interlayer insulating film 122 and the side walls of the respective gates and a gate electrode formed on the gate insulating film in the concave portion (a gate electrode 133 as will be discuss later). The gate electrode of each of the gates is composed of a film of first metal (first metallic film 132 as will be discussed later), and a film of second metal (second metallic film 130 as will be discussed later) which covers the bottom surface and the side surface of the film of first metal and is provided so as to be in contact with the gate insulating film and the side wall of the concave portion. The second metallic film is provided so as to be in contact with the side wall of the concave portion and the gate insulating film. In addition, the gate insulating film of each of the gates is composed of multiple-layered film configured of multiple types of films. The detailed features will be discussed later.

The first gate 210 is constitutionally different from the second gate 212 and the third gate 214, in terms of having a protective insulating film 140 formed on the gate electrode in the concave portion.

Further, contacts 134 coupled to the source-drain regions of the respective gates are provided in the interlayer insulating film 122 of the semiconductor device 100. The contact 134 may be composed of the same material as employed for the gate electrodes of the respective gates. More specifically, each of the contact 134 is configured of a film of first metal (first metallic film 132 as will be discussed later) formed in the inside of the concave portion (contact hole 124 as will be discussed later) in which formed the insulating film 120 and the interlayer insulating film 122, and a film of second metal (second metallic film 130 as will be discussed later), which covers the bottom surface and the side surface of the film of first metal and is provided so as to be in contact with the bottom surface and the side wall of the concave portion.

In the CRAM region 200, bit lines 184 coupled to the respective contacts 134, plugs 186, and plugs 188, are provided in the interlayer insulating films 160, 162 and 172. In addition, the inside of the interlayer insulating film 174 is provided with a capacitor 198, which is composed of a lower electrode 192, a capacitive film 194 and an upper electrode 196. The capacitor 198 is electrically coupled via the plug 188, the plug 186 and the contact 134 to one of the N-type impurity-diffused regions 116a which is formed in the lateral side of the first gate 210. In addition, the other of the N-type impurity-diffused regions 116a formed in the lateral side of the first gate 210 is electrically coupled to the bit line 184.

In addition, in the logic region 202, a plug 186, a plug 188 and a plug 190 which are coupled to the respective contacts 134, are provided in the insides of the interlayer insulating films 160, 162, 172, 174 and 176.

In the present exemplary embodiment, each of the respective plugs and the bit line 184 may be composed of a barrier metal film 180 and a metallic film 182. The barrier metal film 180 may be composed of, for example, titanium (Ti), titanium nitride (TiN), tungsten (W), tungsten nitride (WN), tantalum (Ta) or tantalum nitride (TaN) or the like. In addition, the barrier metal film 180 may be configured of multiple-layered films including, for example, TaN and Ta, deposited thereon. The metallic film 182 may be configured of, for example, copper. The bit line 184 may be configured to have a dual damascene structure. In the logic region 202, the third gate 214 is electrically coupled to the plug 186 formed thereon. Though it is not shown here, the second gate 212 in the P type channel region of the logic region 202 may also be configured to be electrically coupled to the plug 186.

In the DRAM region 200 and the logic region 202, silicide layers 118 are formed on the surface of the N-type impurity-diffused region 116a and the P-type impurity-diffused region 116b. The respective contacts 134 are electrically coupled to the N-type impurity-diffused region 116a and the P-type impurity-diffused region 116b through the silicide layers 118, respectively. In the DRAM region 200 and the logic region 202, transistors are composed of the respective gates and the impurity-diffused regions.

Next, the procedure for manufacturing the semiconductor device 100 in the present exemplary embodiment will be described. FIGS. 2A to 2C, FIGS. 3A and 3B, FIG. 4, FIGS. 5A and 5B, FIGS. 6A and 6B, FIGS. 7A and 7B, and FIGS. 8A and 8B are cross-sectional views, illustrating the procedure for manufacturing the semiconductor device 100.

First of all, the element isolation insulating film 103 is formed in the semiconductor substrate 102 using a known technique. The element isolation insulating film 103 may be composed of, for example, a silicon oxide film. In addition, it may be also configured to form a liner film of silicon nitride film or the like in the bottom surface and the side surface of the element isolation insulating film 103.

Subsequently, the first gate insulating film 104, the second gate insulating film 106 and the third gate film 108 are sequentially formed over the entire surface of the semiconductor substrate 102. The first gate insulating film 104 may be composed of, for example, a silicon oxide film. The second gate insulating film 106 may be composed of, for example, a high dielectric constant film of hafnium oxynitride (HfON) and the like. The third gate film 108 may be composed of, for example, TaN.

Figure 2A:
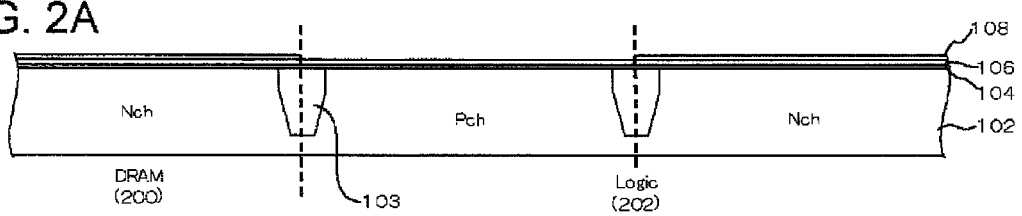
FIGS. 2A to 2C are cross-sectional views of the semiconductor device, illustrating the procedure for manufacturing the semiconductor device.

Subsequently, a resist film (nor shown) is formed to selectively mask the N-type channel region of the DRAM region 200 and the logic region 202, the third gate film 108 of the P-type channel region in the logic region 202 is selectively removed using a wet etching process through a mask of such resist film. Thereafter, the resist film is completely removed (FIG. 2A).

Figure 2B:
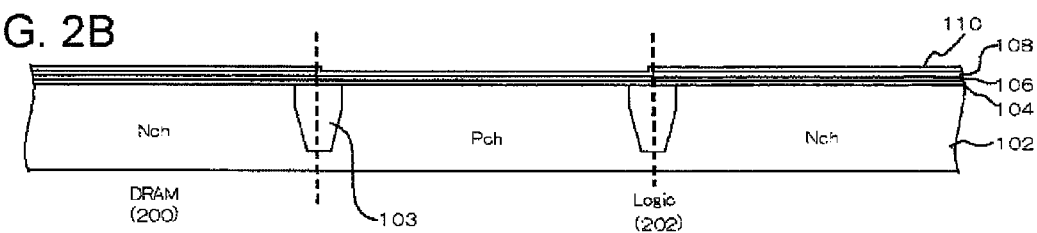

Then, an etch stop film 110, which will serve as an etch stop film in the etching of the polysilicon layer, is formed over the entire surface of the semiconductor substrate 102 (FIG. 2B). The etch stop film 110 may be composed of, for example, TiN.

Figure 2C:
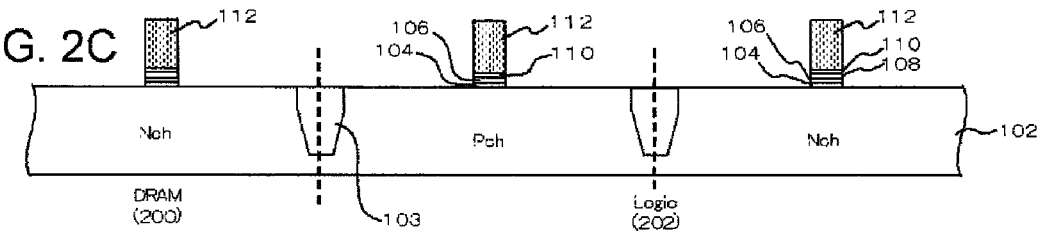

Subsequently, a polysilicon layer 112 is formed on the etch stop film 110 using, for example, a chemical vapor deposition (CVD) process. Subsequently, the etch stop film 110, the third gate film 108, the second gate insulating film 106, the first gate insulating film 104 and the polysilicon layer 112 are sequentially patterned to a shape of the gate electrode using a known lithographic technology (FIG. 2C). This provides a formation of a dummy gate electrode composed of the polysilicon layer 112.

Figure 3A:
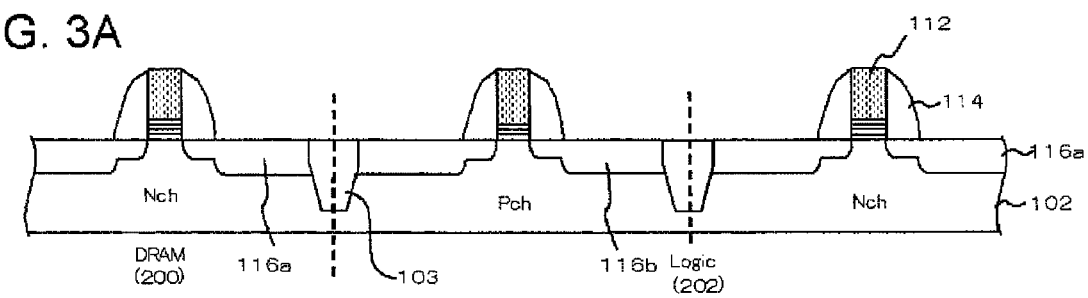
FIGS. 3A and 3B are cross-sectional views of the semiconductor device, illustrating the procedure for manufacturing the semiconductor device.

Thereafter, an ion implantation is conducted over the semiconductor substrate 102 through a mask of polysilicon layer 112 that serves as a dummy gate electrode to create a lightly doped drain (LDD) structure of the N-type impurity-diffused region 116a and the P-type impurity-diffused region 116b. Subsequently, side walls 114 are formed in the lateral sides of the polysilicon layer 112 and the gate insulating film which are patterned to the geometry of the gate electrode. The side wall 114 may be composed of, for example, a silicon nitride film. Subsequently, an ion implantation is conducted over the semiconductor substrate 102 through a mask of the polysilicon layers 112 serving as dummy gate electrodes and the side walls 114 to form the N-type impurity-diffused region 116a and the P-type impurity-diffused region 116b (FIG. 3A). The N-type impurity-diffused region 116a and the P-type impurity-diffused region 116b serve as the source-drain regions of the respective transistors.

Figure 3B:
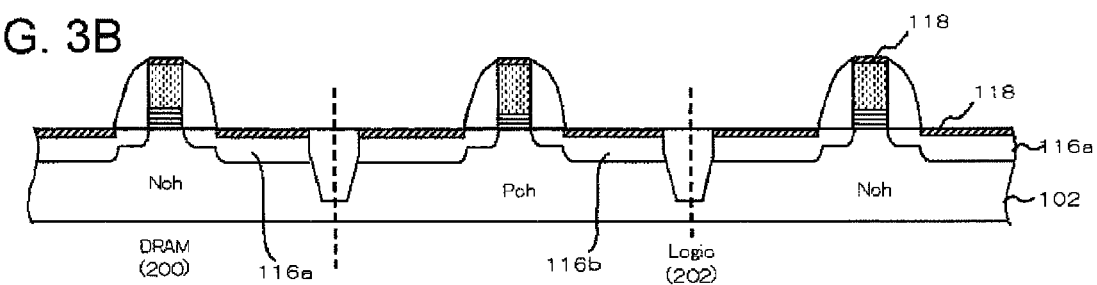

Subsequently, a metallic film is formed over the entire surface of the semiconductor substrate 102. In the present exemplary embodiment, such metallic film is composed of nickel or cobalt. A metallic film can be formed by sputtering. Subsequently, a thermal processing is carried out to cause a reaction of the metallic film with silicon which contacts with the metallic film to form the silicide layers 118. Here the silicide layers 118 are also formed on the polysilicon layer 112 (FIG. 3B). Thereafter, unreacted portions of the metallic film are removed. The silicide layer 118 may be composed of, for example, nickel silicide (NiSi) or cobalt silicide (CoSi).

Figure 4:
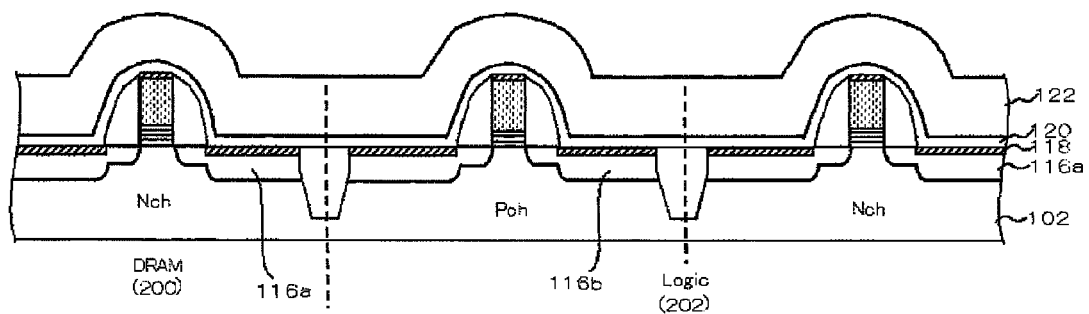
FIG. 4 is a cross-sectional view of the semiconductor device, illustrating the procedure for manufacturing the semiconductor device.

Subsequently, the insulating film 120 and the interlayer insulating film 122 (that constitutes the side wall 114 and the first insulating film) are deposited in this order over the entire surface of the semiconductor substrate 102 to fill the polysilicon layers 112 and the side walls 114 serving as the dummy gate electrodes (FIG. 4). The insulating film 120 may be composed of, for example, a silicon nitride film. The interlayer insulating film 122 may be composed of, for example, a silicon oxide film.

Figure 5A:
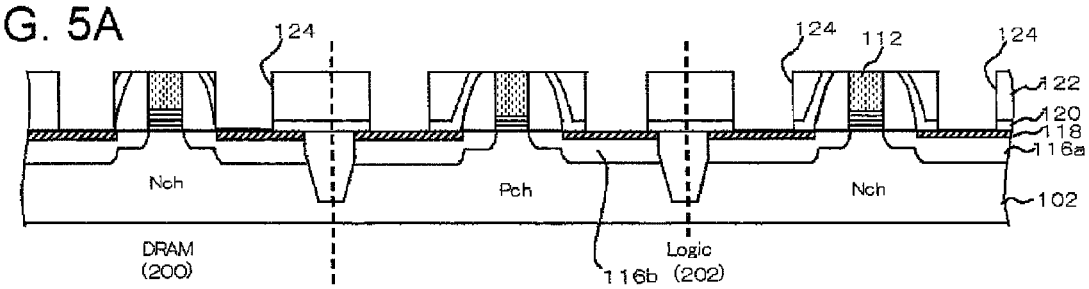
FIGS. 5A and 5B are cross-sectional views of the semiconductor device, illustrating the procedure for manufacturing the semiconductor device.

Then, the surfaces of the interlayer insulating film 122 and the insulating film 120 are planarized using a CMP process. In such case, the portions of the silicide layer 118 disposed on the surface of the polysilicon layer 112 is also removed, then the upper surfaces of the polysilicon layers 112 serving as the dummy gate electrode are exposed. Then, a process such as a dry etching process employing a mask is conducted to selectively remove the interlayer insulating film 122 and the insulating film 120, then the contact hole 124 are formed which are coupled to the P-type impurity-diffused region 116b and the N-type impurity-diffused region 116a, serving as the source-drain region. This allows exposing in the bottom of the contact hole 124 the silicide layers 118, which have been formed on the N-type impurity-diffused region 116a and on the P-type impurity-diffused region 116b (FIG. 5A).

Figure 5B:
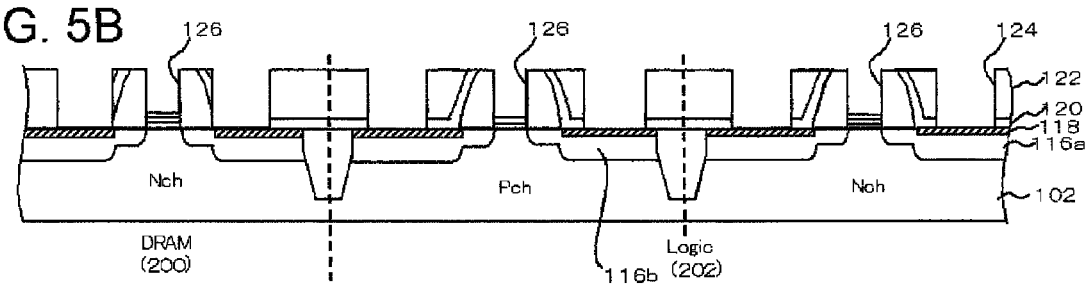

Subsequently, the polysilicon layers 112 serving as dummy gate electrodes are selectively removed using a wet etching process, and then the etch stop film 110 is removed. Therefore respective concave portions 126 within the side walls 114 are formed (FIG. 5B). Here, the contact hole 124 has a diameter, which is larger than the width of the concave portion 126. The width of the concave portion 126 may be determined as, for example, 20 to 50 nm.

Figure 6A:
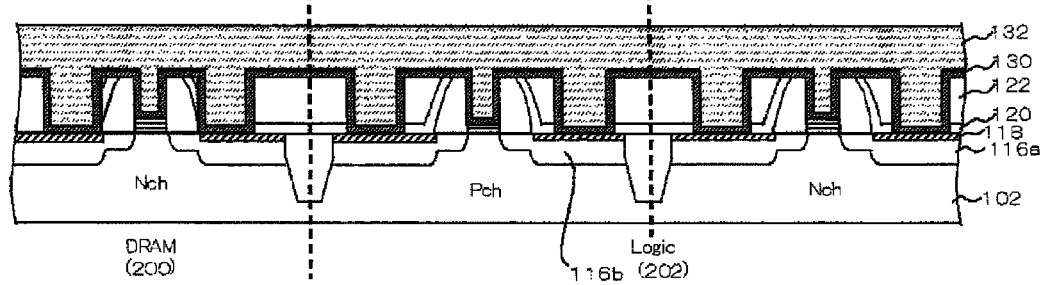
FIGS. 6A and 6B are cross-sectional views of the semiconductor device, illustrating the procedure for manufacturing the semiconductor device.

Subsequently, the second metallic film 130 and the first metallic film 132 are deposited in this order over the entire surface on the semiconductor substrate 102. The second metallic film 130 may be configured of, for example, titanium aluminum nitride (TiAlN). In addition, a thickness of a flat section of the second metallic film 130 may be determined as, for example, 10 nm. The second metallic film 130 is formed to cover the bottom surfaces and the side walls of the concave portions 126 and the contact holes 124 respectively, and concave portions are still remained within the concave portions 126 and the contact holes 124 after the second metallic film 130 is formed. In the present exemplary embodiment, the second metallic film 130 may be configured to have a bottom surface formed in the upper surface of the gate insulating film and a surrounding wall rising from a circumference of such bottom surface in the concave portion 126. In addition, the second metallic film 130 may also be configured to have a bottom surface covering the bottom surface of the contact hole 124 and a surrounding wall rising from a circumference of such bottom surface even in the contact hole 124. Subsequently, the first metallic film 132 is formed on the second metallic film 130 to fill the concave portion in the concave portion 126 (first concave portion) and the contact hole 124 (second concave portion) (FIG. 6A). The first metallic film 132 may be composed of, for example, tungsten (W), aluminum (Al) or copper (Cu) or the like.

Figure 6B:
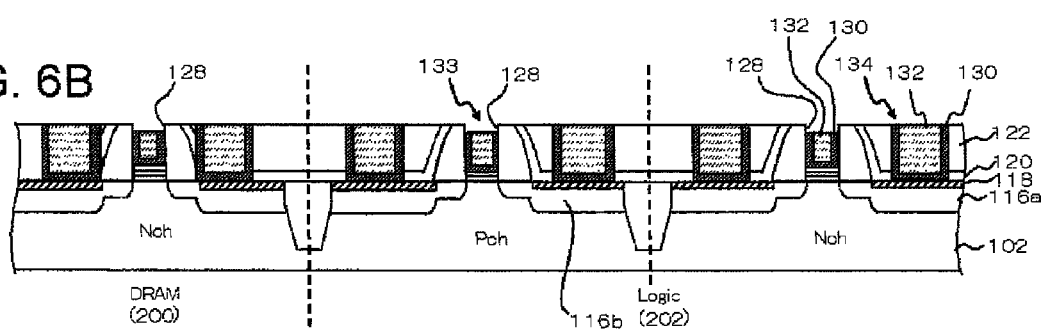

Then, the portions of the first metallic film 132 and the second metallic film 130 exposed out of the concave portion 126 and the contact hole 124 are removed using a CMP. This allows forming the contact 134 in the contact hole 124 and the gate electrode 133 in the concave portion 126. In such case, a slurry containing hydrogen peroxide water at a higher concentration and exhibiting higher oxidizability is employed to conduct a CMP process with higher chemical reactivity, such that the upper portions of the first metallic film 132 and the second metallic film 130 in the concave portion 126 are removed in the concave portion 126 having a smaller diameter to form recesses 128 in the upper portion of the inside of the concave portion 126 (FIG. 6B).

Figure 7A:
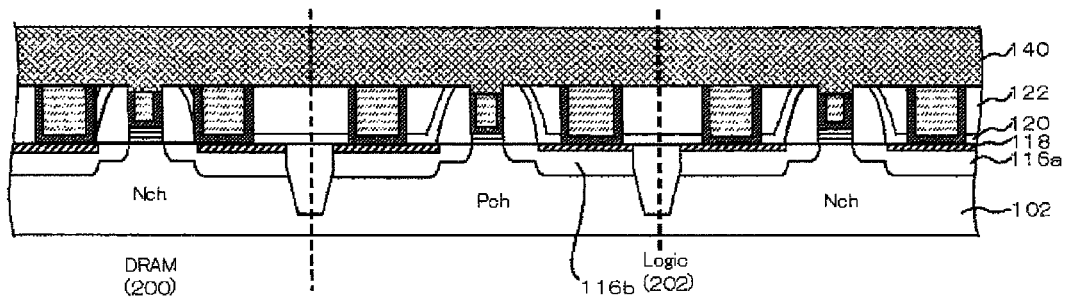
FIGS. 7A and 7B are cross-sectional views of the semiconductor device, illustrating the procedure for manufacturing the semiconductor device.
Figure 7B:
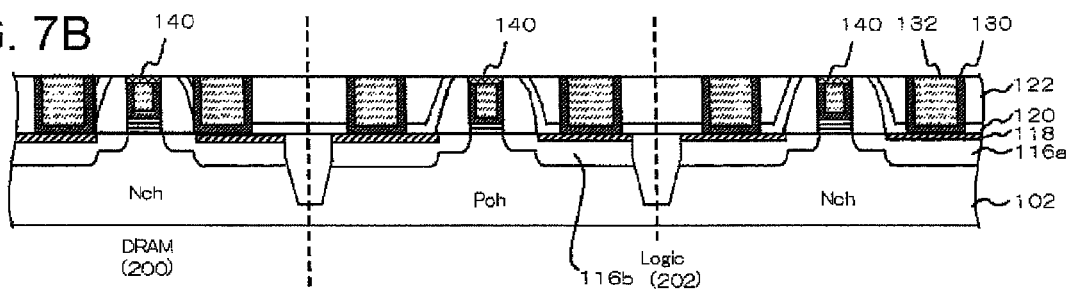

Subsequently, a protective insulating film 140 (second insulating film) is formed over the entire surface of the semiconductor substrate 102 to fill the recess 128 with the protective insulating film 140 (FIG. 7A). Here, the protective insulating film 140 may be composed of, for example, a silicon oxide film. Subsequently, portions of the protective insulating film 140 exposed outside of the recess 128 is removed using the CMP (FIG. 7B). Therefore the protective insulating film 140 is selectively formed on the gate electrode 133 in the concave portion 126.

Figure 8A:
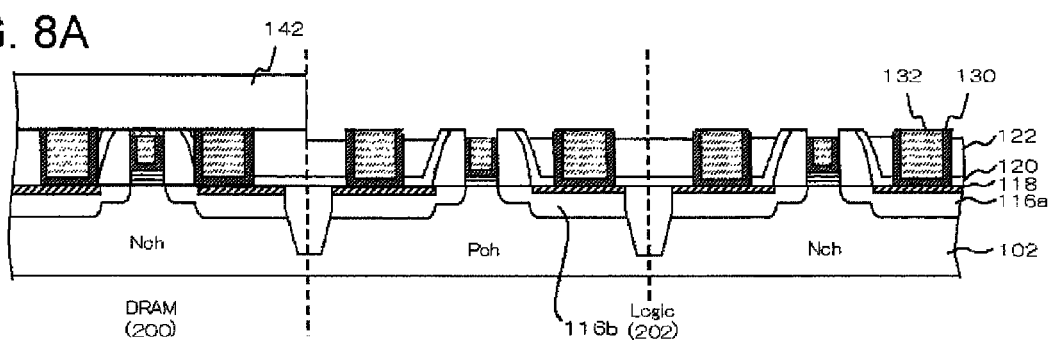
FIGS. 8A and 8B are cross-sectional views of the semiconductor device, illustrating the procedure for manufacturing the semiconductor device.

Then, the portions of the protective insulating film 140 formed in the gate of the logic region 202 is removed. More specifically, a resist film 142 that selectively masks only the DRAM region 200 is formed, and then the protective insulating film 140 is partially removed by etching through the mask of such resist film 142. In such case, when the interlayer insulating film 122 is configured of the silicon oxide film, which is the same material as employed for the protective insulating film 140, the upper portion of the interlayer insulating film 122 is also simultaneously removed (FIG. 8A).

After the resist film 142 is removed, the interlayer insulating film 160 and the interlayer insulating film 162 (second insulating film) are deposited in this order on the entire surface of the semiconductor substrate 102. The interlayer insulating film 160 and the interlayer insulating film 162 may be composed of, for example, a low dielectric constant film. Although it is not shown, other types of films such as etch stop films or the like may be suitably provided between the respective interlayer insulating films as required.

Figure 8B:
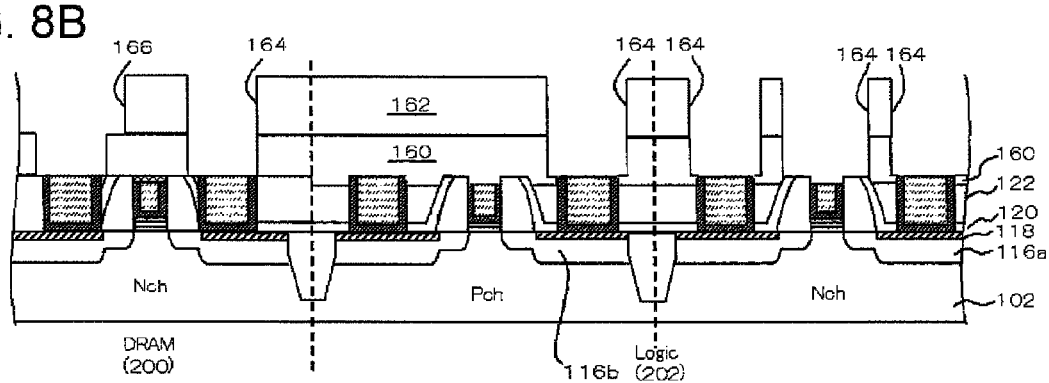

Subsequently, holes 164 for forming the plugs 186 and dual damascene interconnect trenches 166 for forming the bit lines 184 are formed in the interlayer insulating film 160 and the interlayer insulating film 162 (FIG. 8B). The holes 164 and the dual damascene interconnect trenches 166 are formed so as to be coupled to the contacts 134. In addition, in the logic region 202, the holes 164 are formed so as to be coupled to the gate electrodes 133. Then, the interiors of the holes 164 and the dual damascene interconnect trench 166 are filled with the barrier metal film 180 and the metallic film 182. Thereafter, the portions of the metallic film 182 and the barrier metal film 180 exposed outside of the holes 164 and the dual damascene interconnect trenches 166 are removed using the CMP process, the plugs 186 and the bit lines 184 electrically coupled to the contacts 134 and the gate electrodes 133 are formed.

Figure 9A:
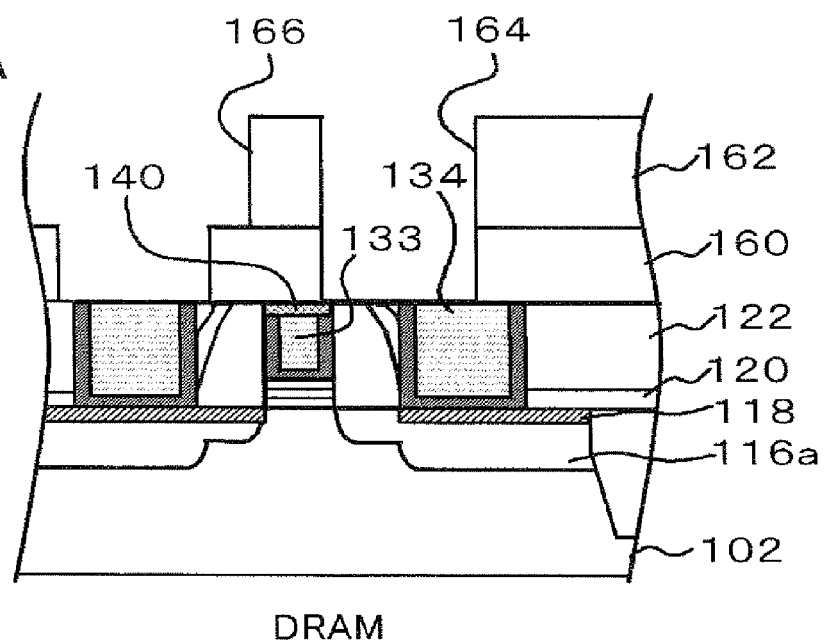
FIGS. 9A and 9B are cross-sectional views of the semiconductor device, illustrating the configuration, in which a misalignment is caused in the pattern during the formation of the contact holes in the exemplary embodiment of the present invention.
Figure 9B:
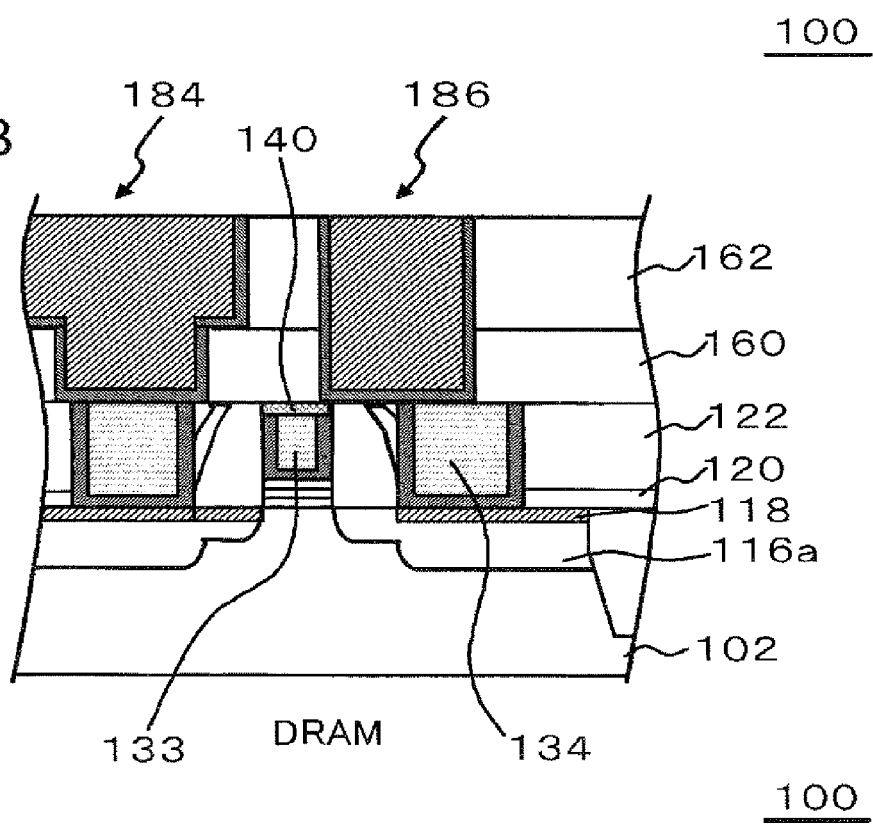
Figure 10:
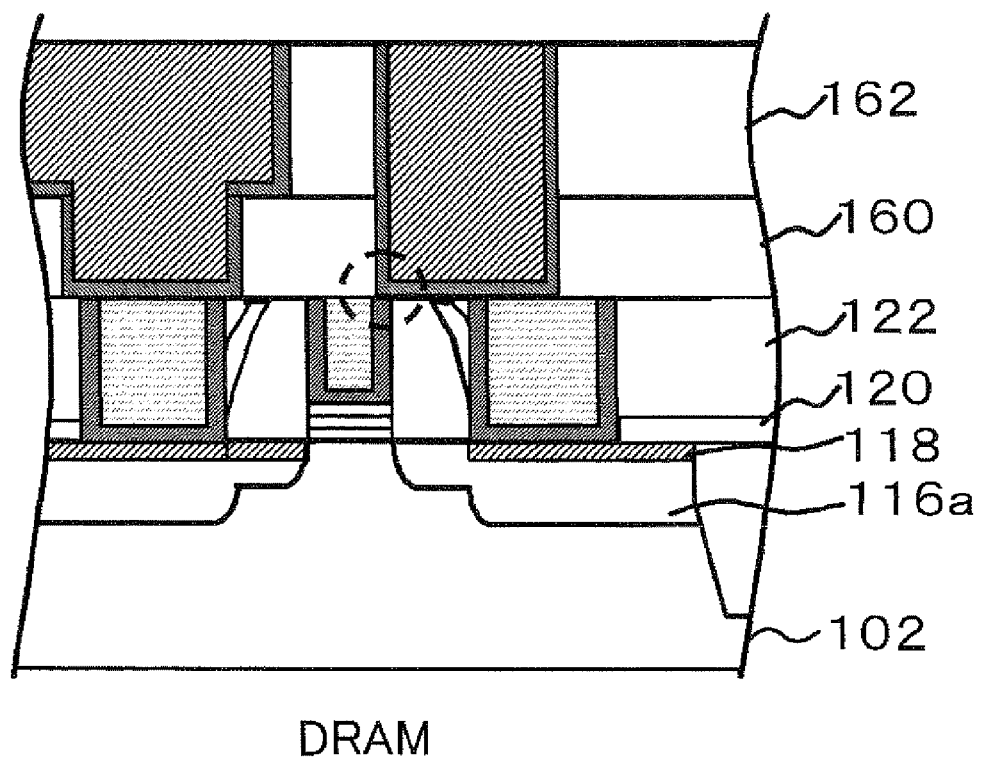
FIG. 10 is a cross-sectional view of the semiconductor device, illustrating the configuration, in which a misalignment is caused in the pattern when a protective insulating film is not present in the upper portion of the gate electrode.

In such case, the protective insulating film 140 is formed over the gate electrode 133 of the first gate 210. Therefore, if a misalignment is caused in the pattern for the holes 164 in the DRAM region 200, a short circuit between the gate electrode 133 and the plug 186 of the first gate 210 can be prevented. Such condition is shown in FIGS. 9A and 9B. FIG. 9A illustrates an exemplary implementation, in which a misalignment for the hole 164 is caused in the DRAM region 200 so that the hole 164 is formed to overlap the first gate 210. If such misalignment is caused in the pattern, an absence of the protective insulating film 140 in the surface of the gate electrode 133 leads to a short circuit between the gate electrode 133 and the plug 186, as schematically indicated by the surrounding dotted line in FIG. 10. However, since the protective insulating film 140 is formed on the gate electrode 133 in the present exemplary embodiment, in the case of causing a pattern misalignment, a short circuit between the bit line 184 or the plug 186 which are formed thereafter, and the gate electrode, can be prevented. FIG. 9B is a schematic diagram, illustrating a structure that the plug 186 and the bit line 184 are formed in the hole 164 and the dual damascene interconnect trench 166 in the configuration of the present exemplary embodiment.

In addition to above, the protective insulating film 140 may be composed of a material, which is capable of providing higher etch selectivity for the interlayer insulating film 160. Such selection of the material allows presenting the structure of the protective insulating film 140 being formed on the surface of the gate electrode 133 without being etched can be achieved, in the case of etching the interlayer insulating film 160 to form the holes 164 and the dual damascene interconnect trenches 166.

Now returning to FIG. 1, the interlayer insulating film 172 is then formed over the entire surface of the semiconductor substrate 102. Thereafter, a hole reaching the plug 186 is formed in the interlayer insulating film 172, and the inside of the hole is filled with the barrier metal film 180 and the metallic film 182. Subsequently, the portions of the metallic film 182 and the barrier metal film 180 exposed outside of the holes are removed using a CMP process to form a plug 188.

Then, the interlayer insulating film 174 is formed on the entire surface of the semiconductor substrate 102. Subsequently, in the DRAM region 200, a concave portion for forming the capacitor 198 in the interlayer insulating film 174 is formed. Then, the concave portion is filled with the lower electrode 192, the capacitive film 194 and the upper electrode 196. Therefore the capacitor 198 is formed. Alternatively, the capacitor may be manufactured by employing other types of configurations and processes.

Thereafter, the interlayer insulating film 176 is formed over the entire surface of the semiconductor substrate 102, and holes reaching the plug 188 is formed in the interlayer insulating film 174 and the interlayer insulating film 176 in the logic region 202, and then the inside of the holes are filled with the barrier metal film 180 and the metallic film 182. Subsequently, the portions of the metallic film 182 and the barrier metal film 180 exposed outside of the holes are removed using a CMP process to form plugs 190. As described above, the semiconductor device 100 having the configuration shown in FIG. 1 is obtained.

Since the protective insulating film 140 can be selectively formed over the gate electrode 133 in the configuration employing the gate last process according to the semiconductor device 100 in the present exemplary embodiment, in the case of causing a pattern misalignment during the formation of the contact 134 in a self-aligning manner, a short circuit between the contact 134 and the gate electrode 133 can be prevented.

In particular, since the DRAM region 200 has fine structure having the distances between the elements, which is narrower than that in logic region 202, higher risk for causing a short circuit between the elements in the case of causing a pattern misalignment is provided. However, since the semiconductor device 100 in the present exemplary embodiment is configured that the gate electrode 133 is protected by the protective insulating film 140 in the DRAM region 200, a short circuit between the contact 134 and the gate electrode 133 can be prevented. In addition, the protective insulating film 140 is removed in the logic region 202. This allows preventing a short circuit in the DRAM region 200 and forming the plug 186 or the like on the gate electrode 133 an electrical coupled therebetween in the logic region 202 in the semiconductor device compatibly containing the DRAM region 200 and the logic region 202.

While exemplary embodiments of the present invention has been fully described above in reference to the drawings, it is intended to present these exemplary embodiments for the purpose of illustrations of the present invention only, and various modifications other than that described above are also available.

The above exemplary embodiment describes the configuration that the DRAM region 200 is protected with the resist film 142 and the all the protective insulating film 140 of the logic region 202 is removed as shown in FIG. 8A. However, such process may not be conducted, and instead, the holes 164 may be formed in the logic region 202 while leaving the protective insulating film 140 and only the DRAM region 200 may be protected with the resist film, then the portions of the protective insulating film 140 exposed in the bottom of the hole 164 of the logic region 202 may be selectively removed.

In addition to above, in the above-described exemplary embodiment, the respective gate insulating films are formed to be substantially flat. This allows controllably reducing the variation in the thickness of the gate insulating film, and establishing the threshold of the respective transistors to a desired value. In particular, when a gate insulating film may be constituted of multiple layered films, or when different thickness or different number of layers are selected for the P-type transistor and the N-type transistor, the control of the threshold can be more easily achieved since the geometry of the gate insulating film is selected to be substantially flat. However, the structure of the gate insulating film is not particularly limited to such configuration, the gate insulating film may be formed on the bottom surface and the side wall in the concave portion 126 after the dummy gate electrode is removed.

It is apparent that the present invention is not limited to the above exemplary embodiment, and may be modified and changed without departing from the scope and spirit of the invention.

What is claimed is:

1. A semiconductor device, comprising:
a semiconductor substrate;
an insulating film formed over said semiconductor substrate;
a first gate, including:
a gate insulating film formed in a bottom surface in a first concave portion formed in said insulating film;
a gate electrode formed over said gate insulating film in said first concave portion; and
a protective insulating film formed over said gate electrode in said first concave portion;
a source-drain region provided in the side of said first gate; and
a contact formed in a second concave portion being formed in the side of said first concave portion in said insulating film and having a diameter that is larger than a diameter of said first concave portion in cross sectional view, and coupled to said source-drain region,
wherein said gate electrode is composed of a film of first metal and a film of second metal coating a bottom surface and a side surface of said film of first metal.

2. The semiconductor device as set forth in claim 1, wherein said contact is composed of said film of first metal and said film of second metal coating a bottom surface and a side surface of said film of first metal.

3. The semiconductor device as set forth in claim 1, wherein a memory region and a logic region are compatibly contained in said semiconductor substrate,
wherein said first gate is formed in said memory region, and
wherein a second gate having the same structure as said first gate excepted that said protective insulating film is not included, is formed in said logic region.

4. The semiconductor device as set forth in claim 3, wherein a plug for electrically coupling to the gate electrode is formed over a gate electrode of said second gate in said logic region.

5. A method for manufacturing a semiconductor device, including:

forming a dummy gate electrode over a semiconductor substrate;

injecting impurity to said semiconductor substrate through a mask of said dummy gate electrode to form a source-drain region;

forming a first insulating film covering said dummy gate electrode, over said semiconductor substrate;

planarizing said first insulating film to expose an upper surface of said dummy gate electrode;

selectively removing said first insulating film to form a contact hole being coupled to said source-drain region in said first insulating film;

removing said dummy gate electrode to form a first concave portion in said first insulating film, said first concave portion having smaller diameter than said contact hole in cross sectional view;

forming a metallic film over the entire surface of said semiconductor substrate to fill said contact hole and said first concave portion with said metallic film;

removing portions of said metallic film exposed outside of said contact hole and said first concave portion using a chemical mechanical polishing (CMP) process to form a contact in said contact hole and a gate electrode in said first concave portion, respectively, and removing portions of said metallic film in an upper portion within said first concave portion to form a recess in the upper portion within said first concave portion;

forming a second insulating film over the entire surface of said semiconductor substrate to fill said recess with said second insulating film;

removing portions of said second insulating film exposed outside of said first concave portion to selectively leave said second insulating film over said gate electrode in said first concave portion;

forming a third insulating film over the entire surface of said semiconductor substrate;

selectively removing said third insulating film to form a hole being coupled to said contact in said third insulating film; and filling the inside of said hole with a conducting film to form a plug, said plug being electrically coupled to said contact.

* * * * *